United States Patent [19]

Nguyen et al.

[11] Patent Number: 5,434,226
[45] Date of Patent: Jul. 18, 1995

[54] EPOXY RESIN TOUGHENED WITH A POLYETHER SULFONE AND POLYARYLSULFIDESULFONE

[75] Inventors: Ly D. Nguyen, Anaheim; Matthew A. Lowry, Orange, both of Calif.; Deborah L. Stone, Saffron Walden; Julie A. Underwood, Witchford, both of England

[73] Assignee: Ciba-Geigy Corporation, Ardsley, N.Y.

[21] Appl. No.: 188,663

[22] Filed: Jan. 28, 1994

Related U.S. Application Data

[63] Continuation of Ser. No. 76,491, Jun. 11, 1993, abandoned, which is a continuation of Ser. No. 928,825, Aug. 11, 1992, abandoned.

[51] Int. Cl.$^6$ .............................................. C08F 283/00
[52] U.S. Cl. ...................................... 525/534; 525/396; 525/537; 525/906; 525/935
[58] Field of Search ............... 525/396, 534, 537, 906, 525/935

[56] References Cited

U.S. PATENT DOCUMENTS

| | | | |
|---|---|---|---|
| 2,633,458 | 3/1953 | Shokal | 260/45.2 |
| 3,053,901 | 9/1962 | Uhlenbroek | 260/609 |
| 3,530,087 | 9/1970 | Hayes et al. | 260/37 |
| 3,641,195 | 2/1972 | Ball et al. | 260/837 |
| 3,715,252 | 2/1973 | Fairbairn | 156/162 |
| 3,737,352 | 6/1973 | Avis et al. | 156/181 |
| 3,784,433 | 1/1974 | Garnish et al. | 156/276 |
| 3,796,624 | 3/1974 | Avis et al. | 156/436 |
| 4,021,596 | 5/1977 | Bailey | 525/537 |
| 4,073,670 | 2/1978 | Mitra | 156/179 |
| 4,100,140 | 7/1978 | Zahir et al. | 526/90 |
| 4,117,038 | 9/1978 | Lehmann et al. | 260/837 |
| 4,131,502 | 12/1978 | Mitra | 156/179 |
| 4,222,918 | 9/1980 | Zentner et al. | 525/906 |
| 4,237,262 | 12/1980 | Jones | 528/322 |
| 4,528,346 | 7/1985 | Sugie et al. | 525/537 |
| 4,543,224 | 9/1985 | Reed et al. | 264/211 |
| 4,557,860 | 12/1985 | DiSalvo et al. | 252/512 |
| 4,608,404 | 8/1986 | Gardner et al. | 523/400 |
| 4,644,039 | 2/1987 | Boyd et al. | 525/422 |
| 4,654,407 | 3/1987 | Domeier | 526/262 |
| 4,656,207 | 4/1987 | Jabloner et al. | 523/400 |
| 4,656,208 | 4/1987 | Chu et al. | 523/400 |
| 4,730,018 | 3/1988 | Robeson | 524/360 |
| 4,822,832 | 4/1989 | Chu et al. | 525/906 |
| 4,849,469 | 7/1989 | Crosby et al. | 524/439 |
| 4,916,016 | 4/1990 | Bristowe et al. | 428/411.1 |
| 5,008,368 | 4/1991 | Nesheiwat | 528/388 |
| 5,028,478 | 7/1991 | Odagiri et al. | 428/283 |
| 5,037,689 | 8/1991 | Boyd | 428/113 |
| 5,037,902 | 8/1991 | Harris et al. | 525/906 |
| 5,049,446 | 9/1991 | Blackwell et al. | 525/537 |
| 5,057,353 | 10/1991 | Maranci et al. | 428/147 |
| 5,070,142 | 12/1991 | Giles, Jr. et al. | 525/66 |
| 5,089,204 | 2/1992 | Kitao et al. | 264/209.4 |
| 5,091,466 | 2/1992 | Aftergut et al. | 524/600 |

FOREIGN PATENT DOCUMENTS

| | | |
|---|---|---|
| 99338 | 12/1984 | European Pat. Off. . |
| 0274899 | 7/1988 | European Pat. Off. . |
| 0365168 | 4/1990 | European Pat. Off. . |
| 0377194 | 7/1990 | European Pat. Off. . |
| 0429861 | 6/1991 | European Pat. Off. . |
| 2900560 | 7/1980 | Germany . |
| 54-129097 | 10/1979 | Japan . |
| 54-142298 | 11/1979 | Japan . |
| 2060490 | 5/1981 | United Kingdom . |

OTHER PUBLICATIONS

Derwent 89-012424.
Derwent 88-202072.
Polymer, 1983, vol. 24, p. 639.
Chem. Abst. 80/51833C/30.
Chem. Abst. 79/83330B/46.
Chem. Abst. 79/90427B/50.
Chem. Abst. 84/025285/05.

*Primary Examiner*—Melvyn I. Marquis
*Assistant Examiner*—Randy Gulakowski
*Attorney, Agent, or Firm*—JoAnn Villamizar; Luther A. R. Hall

[57] ABSTRACT

Thermosetting resin systems exhibiting improved performance characteristics when utilized in composite product applications, said resin systems being modified with a polyarylsulfidesulfone dispersed therein and with a polyethersulfone dissolved therein.

15 Claims, 1 Drawing Sheet

EPOXY RESIN TOUGHENED WITH A POLYETHER SULFONE AND POLYARYLSULFIDESULFONE

This application is a continuation of application Ser. No. 08/076,491, filed Jun. 11, 1993, now abandoned, which is a continuation of Ser. No. 07/928,825, filed Aug. 11, 1992, now abandoned.

BACKGROUND OF THE INVENTION

Much work has been devoted to the toughening of thermosetting resins. Generally, the approach taken has been to add a rubber modifier to a system forming an insoluble second phase to inhibit crack propagation. Another technique involves blending various resins together to obtain the best properties of each, e.g. thermal capabilities and toughness, but this approach rarely yields the optimum properties of each of the resins used, only the optimum compromise of properties. The above approaches necessitate trade-offs. In order to obtain toughness in a cured resin, another property must frequently be sacrificed or reduced, such as chemical resistance or thermal properties. As long as the trade-off is not detrimental to the final application, it is acceptable even though not desirable.

Epoxy resins are typical of such thermosetting resins. Thus, epoxy resins are deficient in properties such as elongation to failure and ability to bear load when damaged. Attempts to modify the resins have involved use of the above noted approaches, particularly rubber modification.

Additionally, the morphology of a toughened epoxy resin system containing a modifier beyond its solubility limit in the thermoset often results in a phase inversion microstructure. The thermoplastic phase in this instance is very susceptible to undesirable solvent crazing. When the thermoplastic content is reduced in an attempt to minimize the crazing, the mechanical properties suffer, particularly the resin fracture toughness.

As previously noted, thermoplastic resins have been added to epoxy resins. For example, U.S. Pat. Nos. 3,715,252, 3,737,352, 3,784,433, 3,796,624, 4,073,670 and 4,131,502 disclose the possible combination of epoxy resins and non heat-curable thermoplastic components including poly(vinylacetal), nylon, neoprene rubber, acrylonitrile rubber, phenoxy resins, polysulfones and α-olefin copolymers. More specifically, U.S. Pat. No. 3,530,087 discloses adhesive compositions containing an epoxide resin and a thermoplastic polysulfone resin. U.S. Pat. No. 3,641,195 discloses curable compositions comprising an epoxide resin dispersed in a thermoplastic copolymer of an α-olefin hydrocarbon with an α-olefin which is an ether or ester of a carboxylic acid. U.S. Pat. No. 4,117,038 discloses epoxy resin adhesives containing a polyglycidyl compound, an acrylonitrile-butadiene-styrene graft polymer and a copolymer of ethylene, acrylic acid and acrylate. Despite the general thermoplastic nature of these materials, they have not provided a broad pattern of increased performance characteristics.

Blends of polyimides and epoxy resins are also known to those skilled in the art. For example, U.S. Pat. No. 4,237,262 discloses compositions containing at least one aliphatic epoxy resin and at least one curable polyimide prepolymer formed from an aliphatic bismaleimide, an aromatic polyamine and an aromatic bismaleimide. German Offenlegungsschrift 2,900,560 likewise discloses mixtures of polyamide-polyimide resins and epoxy compounds. Japanese Kokai 79/129,097 discloses reaction products of an unsaturated bisamide, a phenolic compound and an epoxy compound. Japanese Kokai 79/142,298 discloses epoxy resins derived from bis(4-carboxyphthalimido) compounds and polyepoxides. These systems are distinct.

Europe 99,338 discloses the incorporation of a thermoplastic polyimide into an epoxy resin system which provides a substantially discontinuous phase within the continuous phase of the epoxy resin. As a result, toughness, mechanical and thermal properties are enhanced without significant adverse effect on other performance characteristics. Finally, Europe 274,899 discloses the concept of distributing resin particles as a separate phase throughout prepregs prepared from fiber-reinforced thermosetting resins. The thermosetting resins include epoxy and maleimide resins, among others, while the resin particles are thermoplastic or thermosetting resins or mixtures thereof. Polyamides, polyethersulfone and polysulfone are identified as particularly suitable for use as the resin particle.

It is, accordingly, the primary object of the invention to improve the performance characteristics, particularly toughness, of various thermosetting resin systems without substantially diminishing existing desired properties thereof.

It is a further object to accomplish said improvement in toughness, mechanical and thermal properties by incorporating both a dissolved and a dispersed thermoplastic phase into the thermosetting resin system.

Various other objects and advantages of this invention will become apparent from the following description thereof.

SUMMARY OF THE INVENTION

The present invention relates to a curable composition comprising
(a) at least one thermosetting resin;
(b) from 1 to 30%, by weight, of a polyethersulfone dissolved in said thermosetting resin; and
(c) from about 1 to about 49%, by weight, of a polyarylsulfidesulfone dispersed in said thermosetting resin; and
(d) at least one hardener for said thermosetting resin.

DETAILED DESCRIPTION OF THE INVENTION

Figure 1:
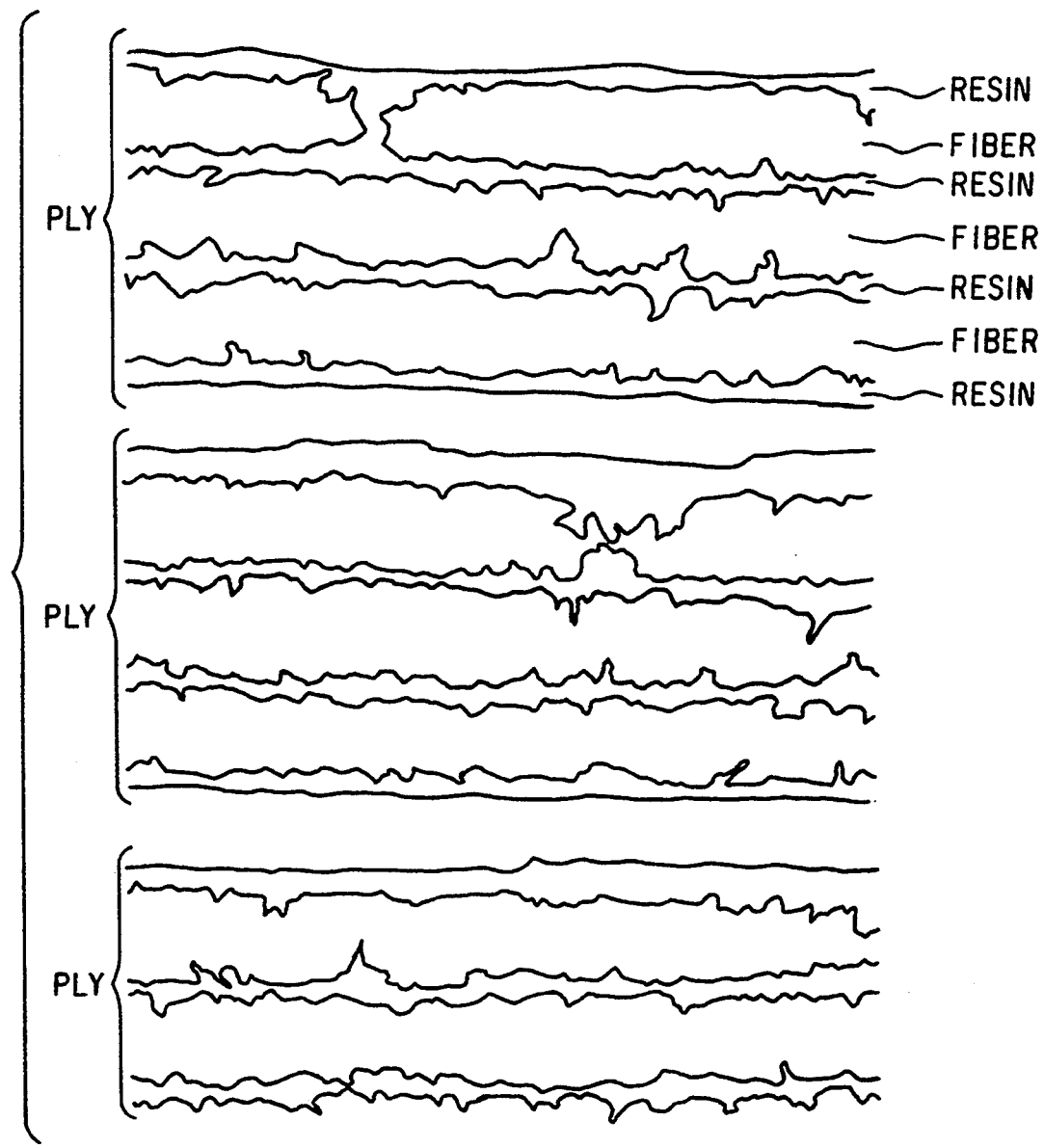
FIG. 1 is a tracing of a micrograph by a scanning electron microscope showing the cross-section of the laminate prepared from resin F in Example 1.

It has now been surprisingly discovered that by incorporating dissolved polyethersulfone and a dispersed polyarylsulfidesulfone into a thermosetting resin system, the toughness, mechanical, thermal and solvent resistant properties of the resulting thermosetting resin are substantially enhanced without adversely effecting, in a substantial way, the other desired properties thereof. Thus, the dissolved material within the ply and the dispersed material appearing primarily at the surface of the prepreg layers provides a substantially discontinuous phase within the continuous phase of the thermosetting resin. The presence of both additives provides the mechanism for improving the above noted properties, particularly the mechanical properties and solvent resistance.

It is further to be noted that these modified prepreg materials have an extended shelf life such that they can be maintained at room temperature for more than 40 days without losing the ability to produce high quality laminates.

Thermosetting resins potentially useful in the present invention include epoxy, bismaleimide, cyanate, polyimide, PMR-15 which is a polyimide prepreg system developed by NASA using 4,4'-methylenedianiline, nadic anhydride and 3,3'4,4'-benzophenonetetracarboxylic dianhydride, acetylene terminated polyimide, phthalocyanine and polybenzoxazole resins and the like. The epoxy and bismaleimide resins are preferred.

The epoxy resins applicable to the instant invention are those possessing on average more than one vic-epoxy group per molecule, i.e., more than one

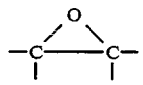

group; which group may be a terminal group, i.e.,

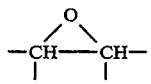

or may be in an internal position.

The polyepoxides may be saturated or unsaturated aliphatic, cycloaliphatic, aromatic or heterocyclic and may be substituted with substituents, such as chlorine, hydroxyl group, ether radicals and the like. In general, they may be based on polyhydric phenols such as those based on bisphenol A, F and S, epoxidation products of cresol novolacs or phenol novolacs, hydantoin epoxide resins, polyglycidyl esters, glycidylated aromatic amines, glycidylated aminophenols, and cycloaliphatic epoxy resins.

More specifically, examples of such polyepoxides include, among others, 1,4-bis(2,3-epoxypropoxy)benzene, 1,3-bis(2,3-epoxypropoxy)benzene, 4,4'-bis(2,3-epoxypropoxy)diphenyl ether, 1,8-bis(2,3-epoxypropoxy)octane, 1,4-bis(2,3-epoxypropoxy)cyclohexane, 2,2-[4,4'-bis(2-hydroxy-3,4-epoxybutoxy)diphenyl]propane, 1,3-bis(4,5-epoxypentoxy)-5-chlorobenzene, 1,4-bis-(3,4-epoxybutoxy)-2-chlorocyclohexane, 1,3-bis(2-hydroxy-3,4-epoxybutoxy)benzene, 1,4-bis(2-hydroxy-4,5-epoxypentoxy)benzene.

Other examples include the epoxy polyethers of polyhydric phenols prepared from halogen-containing epoxides or dihalohydrins in the presence of an alkaline medium. Polyhydric phenols that can be used for this purpose include, among others, resorcinol, catechol, hydroquinone, methyl resorcinol or polynuclear phenols, such as 2,2-bis(4-hydroxyphenol)propane (bisphenol A), 2,2-bis(4-hydroxyphenol)butane, 4,4'-dihydroxybenzophenone, bis-(4-hydroxyphenyl)ethane, 2,2-bis(4-hydroxyphenyl)pentane and 1,5-dihydroxynaphthalene. The halogen-containing epoxides may be further exemplified by 3-chloro-2,3-chloro-1.2-epoxybutane, 3-bromo-1,2-epoxyhexane, 3-chloro-1,2-epoxyoctane, and the like. By varying the ratio of the phenol and epichlorohydrin, one obtains different molecular weight products as shown in U.S. Pat. No. 2,633,458.

A preferred group of the above described epoxy polyethers of polyhydric phenols are glycidyl polyethers of the dihydric phenols. These may be prepared by reacting the required proportions of the dihydric phenol and epichlorohydrin in an alkaline medium. The desired alkalinity is obtained by adding basic substances such as sodium or potassium hydroxide, preferably in stoichiometric excess to the epichlorohydrin. The reaction is preferably accomplished at temperatures within the range of 50° C. to 150° C. The heating is continued for several hours to effect the reaction and the product is then washed free of salt and base. The preparation of four suitable glycidyl polyethers of dihydric phenols is illustrated in U.S. Pat. No. 2,633,458 as Polyethers A, B, C and D.

Other groups of polyepoxides comprise the polyepoxy polyethers obtained by reacting, preferably in the presence of an acid-acting compound, such as Lewis acids or quaternary halides, or of the aforedescribed halogen-containing epoxides such as epichlorohydrin, with a polyhydric alcohol, and subsequently treating the resulting product with an alkaline component; epoxy esters of polybasic acids, epoxy esters of polyethylenically unsaturated mono- and poly-carboxylic acids, epoxy esters of unsaturated alcohols, epoxy esters of unsaturated alcohols and unsaturated carboxylic acids, and the like.

The bismaleimides useful in the formulations of this invention may be any of the bismaleimides derived from aromatic and aliphatic diamines, including any of the well-known and widely available phenylene diamines and the various diamino-substituted polynuclear aromatic compounds such as diaminodiphenyl sulfone, diaminobenzophenone, diaminodiphenylether, diaminodiphenylmethane, and the like, as well as the various aryl compounds having a plurality of aminophenylalkylidene or aminophenoxy substituents. Also useful are bismaleimides based on $C_4$–$C_{20}$ aliphatic diamines such as the various isomeric alkanes having diamino substituents. The bismaleimides may be employed singly or in mixtures comprising two or more bismaleimides, which may include both aromatic and aliphatic bismaleimides. A great variety of bismaleimides suitable for use as matrix resins are well-known in the art, such as are recited for example in U.S. Pat. Nos. 4,644,039, 4,100,140 and 4,654,407.

Preferred bismaleimides include:
N,N'-methylene-bis-maleimide, N,N,'-ethylene-bis-maleimide,
N,N'-hexamethylene-bis-maleimide, N,N'-m-phenylene-bis-maleimide,
N,N'-p-phenylene-bis-maleimide, N,N'-4,4'-diphenylene-bis-maleimide,
N,N'-4,4',3,3'-dichloro-diphenylene-bis-maleimide,
N,N'-diphenylethan-bis-maleimide,
N,N'-4,4'-diphenylsulfone-bis-maleimide, N,N'-p-xylylene-bis-maleimide,
N,N'-m-xylylene-bis-maleimide, N,N',4,4',2,2'-diphenylpropane-bis-maleimide, the
N,N'-bis-maleimide of the 4,4'-diamino-triphenyl-phosphate, and the N,N'-bis-maleimide of the 4,4'-diamino-triphenylthiophosphate.

Especially preferred is the bismaleimide sold by CIBA-GEIGY under the designation MATRIMID 5292.

The applicable polyethersulfones contain in their backbone structure repeating units of the formula

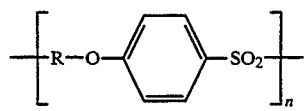

wherein n will generally range from about 10 to about 120, preferably about 50 to about 120 and most preferably about 80 to about 100 and R is selected from the group consisting of

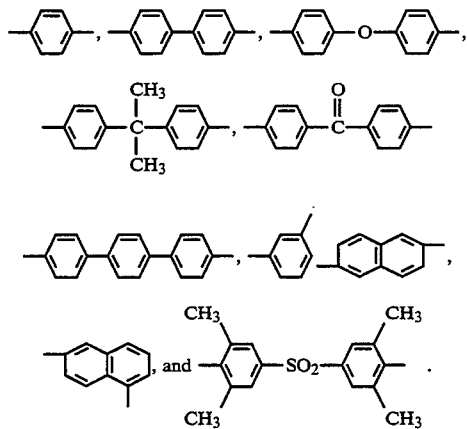

In a preferred embodiment, the polyethersulfones are represented by the following formula:

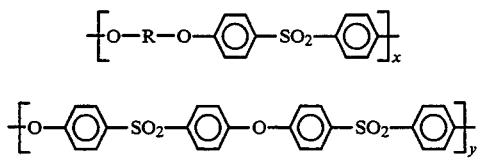

wherein R is as defined above and the ratio of x to y is 10:90 to 60:40, preferably 20:80 to 50:50 and most preferably 25:75 to 40:60. The polyethersulfones are described in U.S. Pat. No. 4,730,018 which is hereby incorporated by reference.

These materials are commercially available under such designations as VICTREX ® from ICI Corporation, RADEL ® from Amoco Corporation and UDEL ® from Amoco Corporation.

The applicable polyarylsulfidesulfone contain in their backbone structure repeating units of the formula

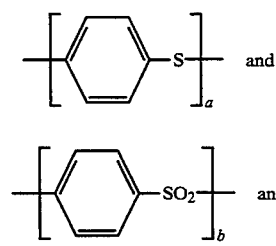

wherein the ratio of a to b is 1:49 to 49:1, and the aromatic rings are either unsubstituted or substituted by 1 to 4 substituents, preferably 2 substituents, selected from the group consisting of alkyl groups, preferably $C_1$–$C_{12}$ alkyl; aryl, preferably phenyl and alkylphenyl, halogen, preferably Cl, Br, I and F; thioalkyl, preferably —$SCH_3$, —$SC_2H_5$, and —$SC_6H_5$ and ether groups, preferably —$OCH_3$, —$OC_2H_5$ and —$OC_6H_5$.

Thus, the first structure (A) generally referred to as poly(phenylene sulfide) is composed of a series of alternating aromatic rings (substituted and unsubstituted) and sulfur atoms, while the second structure (B) exhibits aromatic rings linked by sulfone groups.

The polyarylsulfidesulfones may additionally contain other terminal groups such as hydroxy, amine, chloro, bromo, iodo and thio. These materials are also commercially available under such designations as RYTON ® from Phillips.

It is additionally to be noted that dispersion of the polyarylsulfidesulfone and positioning of the material at the surface of the individual plies of the laminate configuration can be facilitated by utilizing materials which exhibit average particle sizes ranging from 0.1 to 100 μm, and preferably 10–40 μm.

The general procedure for preparing the modified thermosetting resins of the invention involves dissolving the polyethersulfone in the thermosetting resin at a temperature ranging from 100° to 300° C. to provide a homogeneous system and thereafter adding sequentially the hardener system for the resin and the polyarylsulfidesulfone or alternatively the polyarylsulfidesulfone followed by the hardener. Stirring is continued after each addition, with temperatures for hardener addition ranging from 25° to 125° C. and temperatures for polyarylsulfidesulfone addition ranging from about 25° to 125° C. The resulting product containing the dissolved polyethersulfone and the dispersed polyarylsulfidesulfone is then cooled and is available for immediate use or storage.

Concentrations of polyethersulfone and polyarylsulfidesulfone are selected to provide an excellent combination of toughness characteristics, mechanical performance and solvent resistance. The concentration of polyethersulfone ranges from 1 to 30%, by weight of the total formulation, and preferably 5 to 25%; while the concentration of polyarylsulfidesulfone ranges from 1 to 49%, by weight of the total formulation, and preferably 3 to 30%.

A particularly preferred embodiment of the present invention relates to a curable composition comprising
 (a) at least one thermosetting resin;
 (b) from 1 to about 30%, by weight, of a polyethersulfone having repeating units of the formula

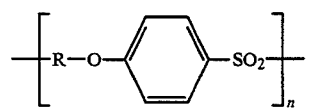

wherein R is selected from the group consisting of

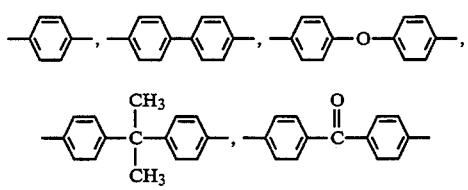

-continued

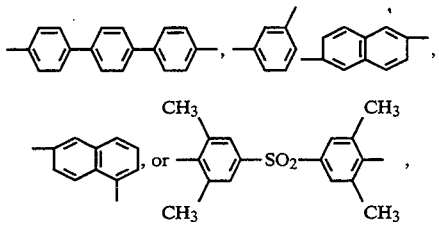

and n is about 10 to about 120, dissolved in said thermosetting resin;

(c) from about 1 to about 49%, by weight, of a polyarylsulfidesulfone having repeating units of the formula

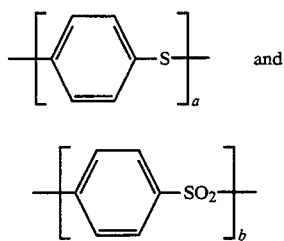

wherein the ratio of a to b is 1:49 to 49:1, and the aromatic rings are either unsubstituted or substituted by 1 to 4 substituents selected from the group consisting of include alkyl groups, aryl, halogen, thioalkyl and ether groups, dispersed in said thermosetting resin; and (d) at least one hardener for said thermosetting resin.

As hardeners there may be used, for example, aromatic polyamines containing at least three amino hydrogen atoms, such as p-phenylenediamine, m-phenylenediamine, bis(4-aminophenyl)methane, bis(4-aminophenyl) ether, bis(4-aminophenyl) ketone, aniline-formaldehyde resins, bis(4-aminophenyl) sulfone, bis(3-aminophenyl)sulfone and 2,4'-diaminodiphenyl sulfone; hydrophthalic anhydride, hexahydrophthalic anhydride, endonethylenetetrahydrophthalic anhydride, hexachloroendomethylenetetrahydrophthalic anhydride and pyromellitic dianhydride; and catalytic hardeners such as dicyandiamide, semicarbazide and polyhydrazides such as isophthalyl dihydrazide, sebacyl dihydrazide and adipyl dihydrazide. The preferred hardeners are bis(4-aminophenyl)sulphone, bis(3,5-diethyl-4-aminophenyl)methane, bis(3-methyl-5-isopropyl-4-aminophenyl)methane and dicyandiamide, since they are relatively unreactive with the thermosetting resin in the blending operation but cure on further heating to form products distinguished by the indicated performance improvements. The hardener is utilized in stoichiometric amounts ±50% relative to the modified epoxy resin, with 1:1 stoichiometry being preferred.

Instead of a single hardener, a combination of at least two of the hardeners listed above can also be used. Preferred combinations of hardeners include bis(4-aminophenyl) sulfone and bis(3,5-diethyl-4-aminophenyl)methane, and bis(3-methyl-5-isopropyl-4-aminophenyl)methane and bis(4-aminophenyl) sulfone and the like. Most preferably, a combination of bis(4-aminophenyl) sulfone and bis(3,5-diethyl-4-aminophenyl)methane is employed. This approach is very efficient in obtaining a mechanical-out-life greater than 1,000 hours as required by some important industrial applications. The mechanical-out-life is defined as the maximum exposure time of the prepreg material at room temperature without causing property degradation to the laminates made of such a prepreg. For example, the high toughness expressed in terms of compression-after-impact which can be achieved by the toughening approach described in this patent, should remain one of the characteristics of the material after prolonged exposure of the prepreg at room temperature for at least 1,000 hours. The combination of hardeners fully satisfies this requirement.

The modified resins prepared according to the invention can furthermore be mixed, at any stage before cure, with usual modifiers such as extenders, fillers and reinforcing agents, pigments, dyestuffs, organic solvents, plasticizers, tackifiers, rubbers, accelerators, diluents, and the like. As extenders, reinforcing agents, fillers and pigments which can be employed in the curable mixtures according to the invention there may be mentioned, for example: coal tar, bitumen, glass fibers, boron fibers, carbon fibers, cellulose, polyethylene powder, polypropylene powder, mica, asbestos, quartz powder, gypsum, antimony trioxide, bentones, silica aerogel ("aerosil"), lithopone, barite, titanium dioxide, carbon black, graphite, iron oxide, or metal powders such as aluminum powder or iron powder. It is also possible to add other usual additives, for example, flameproofing agents, agents for conferring thixotropy, flow control agents such as silicones, cellulose acetate butyrate, polyvinyl butyral, waxes, stearates and the like (which are in part also used as mold release agents) to the curable mixtures.

The curable mixtures can be manufactured in the usual manner with the aid of known mixing equipment (stirrers, kneaders, rollers and the like).

The subsequent curing of the modified thermosetting resin compositions of this invention is within the knowledge of the art. Curing is effected at room temperature up to temperatures of between 120° to 300° C. for the appropriate period of time in the presence of the indicated hardener.

Upon curing at elevated temperatures, a network of high crosslink density occurs. Accordingly, the expression "cure" as used herein, denotes the conversion of the thermosetting materials, into insoluble and infusible crosslinked products, with simultaneous shaping to give shaped articles such as castings, pressings or laminates, or to give two-dimensional structures such as coatings, enamels or adhesive bonds. The modified systems are advantageous for the formation of coatings because of the improved toughness of the resulting cured coatings.

Modified resins such as those described above have application in a broad range of end uses such as in composites, printed circuit boards, castings, molding compounds, adhesives and coatings. In view of the improved performance characteristics, the application of greatest interest is in high performance composite applications, pertinent, for example to the aerospace industry. Thus, the modified resins are utilized to pre-impregnate various fibers for eventual use as honeycomb core skins or structural parts. Techniques for preparing prepregs are well known to those skilled in the art. In terms of honeycomb core skins and structural parts, graphite, glass, Kevlar reinforced skins and parts as well as others, can be readily prepared from the instant systems. Correspondingly, techniques for preparing laminates are well known. Such laminates may be prepared by compression or autoclave molding and may comprise a broad range of thicknesses. It is to be noted that the dispersed polyarylsulfidesulfone appears at the surface of the individual plies such that upon preparation of the laminate, said dispersed phase is to be found in substantial amounts between the plies of the laminate.

The modified systems of this invention are thus seen to reflect the integration of two basic concepts. Thus, they reflect a continuous phase by virtue of the dissolved polyethersulfone and a discontinuous phase consisting of the polyarylsulfidesulfone which combine to improve the toughness, mechanical properties and solvent resistance of a standard thermosetting resin.

The following examples illustrate the preferred embodiments of this invention. In these examples, all parts given are by weight unless otherwise noted.

Example 1

This example illustrates the preparation of typical modified epoxy resin systems of the invention.

Formulations are prepared utilizing the following components:

|  | parts |  |  |  |  |  |  |  |  |
|---|---|---|---|---|---|---|---|---|---|
|  | A | B | C | D | E | F | G | H | R |
| triglycidyl p-aminophenol A |  |  |  |  |  |  |  |  | 30 |
| tetraglycidyl diamino-diphenyl methane (4) |  |  |  |  |  |  |  |  | 30 |
| tetraglycidyl-m-xylene diamine (1) | 49 | 49 | 49 | 49 | 48 | 48 | 45 | 48 | — |
| polyethersulfone (2) | 19 | 15 | 10 | 5 | 6 | 6 | 7 | 6 | 18 |
| polyarylsulfide-sulfone (3) | 8 | 12 | 17 | 22 | 23 | 23 | 20 | 23 | — |
| bis(3-aminophenyl)sulfone | 24 | 24 | 24 | 24 | — | — | — | — | 22 |
| bis(4-aminophenyl)sulfone | — | — | — | — | 13 | 10 | — | 10 | — |
| bis(3,5-diethyl-4-aminophenyl)methane | — | — | — | — | 10 | 13 | 28 | 13 | — |

(1) TETRAD-X ® from Mitsubishi
(2) PES 5003 P ® from ICI Americas, Inc.
(3) PPS-S ® from Phillips
(4) ARALDITE ® MY720 from CIBA-GEIGY Corp.

In each instance, a mixing vessel is charged with the epoxy material and heated to 65° C. Thereafter, the polyethersulfone is added, the temperature is increased to 132° C.–143° C. and the mix is stirred for a period of one hour. The mixture is cooled to 105° C.–115° C. with addition of any bis-methane component over 10 minutes, further cooled to 82° C.–93° C. with addition of all bis-sulfone over a 10 minute period and finally cooled to 71° C.–82° C. with addition of the polyarylsulfidesulfone. Mixing is continued for 15 minutes to complete the epoxy resin modification.

Example 2

In order to demonstrate the utility of the modified resin systems in composites, graphite reinforced laminates are fabricated. Prepreg is made by coating the resin onto release paper at a temperature of 65° C., at a level of 53±3 grams/$M^2$ and then applying the dried films to both sides of graphite fiber present at 190±5 grams/$m^2$. The unidirectional prepreg is layed up by stacking 24 plies in the following fiber orientation: $[(+45/0/-45/90)3]_s$; and repeating the sequence to achieve a balanced symmetrical lay up. The laminate is then compression molded for 2.5 hours at 175° C. 100 psi to cure the system. The resin content of the cured laminate is 35±2% by weight. Various tests are run on these laminates and are summarized below.

Out-Life—Prepreg prior to lamination is maintained at room temperature for the indicated period of time. Failure is evidenced by inability to meet the CAI requirement.

Compression—After-Impact(CAI)—Tests the ability to perform, i.e. retention of toughness, and is conducted by applying a drop weight energy of 1500 in-lb/in to the center of the laminate and then measuring compressive strength by Boeing BSS 7260.

Compression Strength—Conducted according to ASTM D-695.

Open-Hole Compression—Conducted according to Boeing BSS 7260.

Fracture Toughness—Conducted according to Boeing BMS8-276A.

Compression Interlaminar Shear—Conducted according to Boeing BMS8-276A

|  | A | B | C | D | E | F | G | R |
|---|---|---|---|---|---|---|---|---|
| Out-Life (hrs.) | — | — | — | 400 | 800 | 1000 | 1400 | — |
| CAI Strength (ksi) | 40.0 | 45.2 | 50.0 | 53.3 | 48.8 | 46.4 | 43.0 | 32.3 |
| CAI Strength (ksi) after Out-Life | — | — | — | — | 47.9 | 47.6 | 46.6 | — |
| Compression Strength (ksi) |  |  |  |  |  |  |  |  |
| @23° C. | — | — | 232 | 215 | 224 | 218 | — | 248 |
| @82° C. | — | — | 207 | — | 184 | 198 | — | 219 |
| @82° C. *wet after immersion | — | — | 164 | — | 172 | 174 | — | 195 |
| Open-Hole Compression (ksi) |  |  |  |  |  |  |  |  |
| @23° C. | — | 47.6 | 48.8 | 47.9 | 45.7 | 46.0 | — | 50.0 |
| @82° C. | — | — | — | — | 39.2 | 38.7 | — | — |
| @82° C. wet | — | — | — | — | 34.0 | 33.6 | — | — |
| Fracture Toughness (in-lb/in.$^2$) |  |  |  |  |  |  |  |  |
| $G_{IC}$ | 3.84 | 3.41 | 2.45 | 3.43 | 2.43 | 1.89 | — | 2.92 |
| $G_{IIC}$ | 6.71 | 6.56 | 13.1 | 11.2 | 12.7 | 12.0 | — | 3.85 |
| Compression Interlaminar Shear (ksi) |  |  |  |  |  |  |  |  |
| @23° C. | — | — | — | — | 9.80 | 9.81 | — | 13.8 |
| @82° C. | — | — | — | — | 9.31 | 8.29 | — | — |
| @82° C. wet | — | — | — | — | 8.01 | 8.10 | — | — |

*wet = immersion in $H_2O$ for 14 days at 70° C.

These data indicate that the addition of the dissolved and dispersed polysulfone phases improves the overall strength and toughness of the cured resin. It is also evident that the addition improves the elevated temperature performance.

Example 3

The following formulations are prepared and tested according to the general procedures of Examples 1 and 2. The short beam shear tests are conducted according to ASTM D-2344.

| | I | J | K | L | M |
|---|---|---|---|---|---|
| triglycidyl p-aminophenol A (MY0510 from CIBA-GEIGY Corp.) | — | 38 | — | — | — |
| tetraglycidyl diaminodiphenyl methane (4) (MY720 from CIBA-GEIGY Corp.) | — | 38 | — | — | — |
| tetraglycidyl diaminodiphenyl methane (5) | 32 | — | 30 | 30 | 30 |
| diglycidyl ether of resorcinol (6) | 38 | — | 38 | 38 | 38 |
| polyethersulfone (2) | 32 | 24 | 32 | 20 | 6 |
| polyarylsulfidesulfone (3) | 6 | 10 | 6 | 18 | 32 |
| bis(3-aminophenyl)sulfone | 32 | 29 | — | — | — |
| bis(4-aminophenyl)sulfone | — | — | — | — | 32 |
| bis(3,5-diethyl-4-aminophenyl)methane | — | — | — | 41 | — |
| 2,4-dimethyl-3,5-dithiomethyl-toluene | — | — | 27.5 | — | — |
| dicyandiamide | — | — | — | — | 3 |
| CAI Strength (ksi) | 50 | 34 | 39.3 | 42.6 | 47.8 |
| Compression Strength (ksi) | | | | | |
| @23° C. | 255 | 230 | — | — | — |
| @82° C. wet after immersion | 190 | 210 | — | — | — |
| Open-Hole Compression (ksi) | | | | | |
| @23° C. | 45.3 | 48.6 | — | — | — |
| @82° C. wet after immersion | — | 40.4 | — | — | — |
| Fracture Toughness | | | | | |
| (in-lb)/in$^2$)$G_{IC}$ | 4.5 | — | 6.2 | — | — |
| $G_{IIC}$ | 5.8 | — | 4.1 | — | — |
| Short Beam Shear (ksi) | | | | | |
| @23° C. | 15.3 | — | — | — | — |
| @82° C. | 12.4 | — | — | — | — |
| @82° C. wet after immersion | 10.7 | — | — | — | — |

(4) ARALDITE ® MY-720 from CIBA-GEIGY Corp.
(5) ARALDITE ® MY-721 from CIBA-GEIGY Corp.
(6) HELOXY ® 69 from Wilmington Chemical Corp.

Example 4

A Z blade Winkworth mixer is heated to approximately 130°–140° C. On reaching this temperature, it is charged with 51.27 MY721(5), 10.90 parts triglycidyl p-aminophenol and 8.97% parts VICTREX ® 5003P (2). The lid is closed and a vacuum of 25–30 mm Hg is applied, together with moderate stirring. Stirring is continued under vacuum until the Victrex ® 5003P has fully dissolved (~1 hr). The temperature is then cooled to 80° C. and 8.97 parts the polyarylsulfidesulfone (3) is gradually added with slight stirring under vacuum for ~20 minutes until full dispersion. 16.02% parts bis(4-aminophenyl)sulfone and 3.85% parts (1:1 blend of triglycidyl p-aminophenol and micronized dicyandiamide) are then added and stirred under vacuum for ~½ hr until fully mixed. The mix is then decanted into trays for cooling and storage.

The resulting resin is used to make unidirectional prepreg tape with PAN based carbon fibre and T300 based woven CF prepreg. The prepreg contains approximately 34% weight resin and has a fiber area weight of 137 gsm. The woven prepreg contains approximately 40% by weight resin. A number of different laminates with varying ply orientations are laid up with this prepreg. These are cured in an autoclave for 2 hrs at 180° C. using a 2°–5° C./min heat up rate. They are then post-cured for 2 hrs at 180° C. free-standing in a convention oven.

Test specimens are cut from each laminate and are tested according to the tests of Example 2.

A control containing 17.94 parts 5003P and no polyarylsulfidesulfone is prepared by substantially the same procedure.

Laminates are also prepared in a similar way and tested as for Example 2. Tests not covered in the previous examples are described hereinafter.
Tension strength and tension modulus—ASTM D-3039.
Open Hole Tension (OHT)—laminate specimens with given layups are 0.75 in. × 5.6 in. with center holes of 0.125 in. diameter.
Glass Transition Temperature (Tg)—measured using Polymer Laboratories Dynamic Mechanical Thermal Analyzer (DMTA).

See Table 2 for summary of results.

TABLE 2

| Composite Properties | | Example 4 Fibre [a] ksi | Control Fibre [b] | Control Fibre [a] |
|---|---|---|---|---|
| UD Material | | | | |
| Short Beam Shear (ksi) | RT Dry | 16.7 | 16.5 | 16.1 |
| | RT Wet | 20.3 | 16.0 | 15.2 |
| | 93° C. Dry | 12.8 | 12.6 | 12.8 |
| | 93° C. Wet | 10.7 | 10.4 | 10.2 |
| | 135° C. Dry | 11.0 | 11.0 | 10.7 |
| | 135° C. Wet | 8.7 | 9.3 | 8.7 |
| Tg (°C.) Flexural Mode Modulus Decay | | 200 | — | 197 |
| Tensile Strength (ksi) | | 345.9 | 384 | 358 |
| Tensile Modulus (msi) | | 24.1 | 25.7 | — |
| Fracture Toughness | | | | |
| $G_{IC}$ (in-lb/in$^2$) | | 2.51 | 2.07 | 2.45 |
| $G_{IIC}$ (in-lb/in$^2$) | | 3.84 | — | 3.49 |
| OHT [(0, 90)$_2$]$_s$ (ksi) | | 110.0 | 135 | 102 |
| OHT [(0, +45, −45, 0, 90)$_3$]$_s$ (ksi) | | 54.5 | 68.4 | 62.4 |
| OHT [(0, +45, −45, 90)$_2$(0, 0-45, +45, 0)]$_s$ (ksi) | | 80.8 | 112 | — |

TABLE 2-continued

| Composite Properties | | | | |
|---|---|---|---|---|
| CAI (ksi) | | 34.8 | 34.1 | 25.4 |
| Wet = 48 hrs in H2O at 89° C. | | | | |
| | | Example 4 | Control | |
| Woven Fabric | | | | |
| Short Beam Shear (ksi) | RT Dry | 10.4 | 11.0 | |
| | RT Wet | 10.3 | 10.2 | |
| | 93° C. Dry | 9.7 | 9.7 | |
| | 93° C. Wet | 8.3 | 8.1 | |
| | 135° C. Dry | 8.6 | 8.6 | |
| | 135° C. Wet | 5.4 | 5.5 | |
| 8H satin, T300 fibre, 370 gsm | | | | |
| Fracture Toughness | | | | |
| $G_{IC}$ | | 3.86 | 3.08 | |
| $G_{IIC}$ | | 11.6 | 7.18 | |

The toughness of this system is an improvement over the control.

Example 5

FIG. 1 is a tracing of a micrograph by a scanning election microscope showing the cross-section of the laminate prepared from resin F in Example 1.

The tracing is prepared by:
1. Cutting a Specimen (1.8–2.5 cm length × 1.3–1.8 cm height) from the Laminate mounted in an epoxy mold and ground/polished for observation and measurements (through microscopy).
2. Taking Micrographs at 100× magnification of the specimen using the Unitron 7982 Unimet metallograph.
3. Tracing Specimen plies and resin layers (area between plies) from the micrographs onto transparent paper.

Summarizing, it is seen that this invention provides improved thermosetting resin systems, said improvements stemming from the introduction of both dissolved polyethersulfone and dispersed polyarylsulfidesulfone. Variations may be made in procedures, proportions and materials without departing from the scope of the invention as defined by the following claims.

What is claimed is:
1. A curable composition comprising
   (a) at least one thermosetting epoxy resin;
   (b) from 1 to 30%, by weight, of a polyethersulfone dissolved in said thermosetting resin; and
   (c) from about 1 to about 49%, by weight, of a polyarylsulfidesulfone dispersed in said thermosetting resin; and
   (d) at least one hardener for said thermosetting epoxy resin.
2. The composition of claim 1, wherein said thermosetting resin is at least one epoxy resin having more than one vic-epoxy group.
3. The composition according to claim 2 wherein said epoxy resin is at least one saturated or unsaturated aliphatic, cycloaliphatic, aromatic or heterocyclic which is either unsubstituted or substituted with chlorine, hydroxy or ether.
4. The composition according to claim 2 wherein said epoxy resin is based on a polyhydric phenol, an epoxidation product of cresol novolac or phenol novolac, hydantoin epoxide resin, polyglycidyl ester, glycidylated aromatic amine, glycidylated aminophenol or cycloaliphatic epoxy resin.
5. The composition according to claim 1 wherein component (b) is present in an amount of 5 to 25% by weight.
6. The composition according to claim 1 wherein component (c) is present in an amount of 3 to 30% by weight.
7. The composition according to claim 1 wherein said hardener is selected from the group consisting of aromatic polyamines containing at least three amino hydrogen atoms, hydrophthalic anhydride, hexahydrophthalic anhydride, endomethylenetetrahydrophthalic anhydride, hexachloroendomethylenetetrahydrophthalic anhydride, pyromellitic dianhydride, dicyandiamide, semicarbazide and polyhydrazides.
8. The composition according to claim 1 wherein said hardener is selected from the group consisting of bis(4-aminophenyl)sulphone, bis(3,5-diethyl-4-aminophenyl)methane, and dicyandiamide.
9. The composition according to claim 1 wherein said polyethersulfone contain in their backbone structure repeating units of the formula

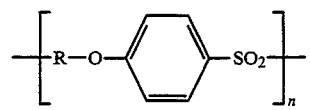

wherein n is from about 10 to about 120, and R is selected from the group consisting of

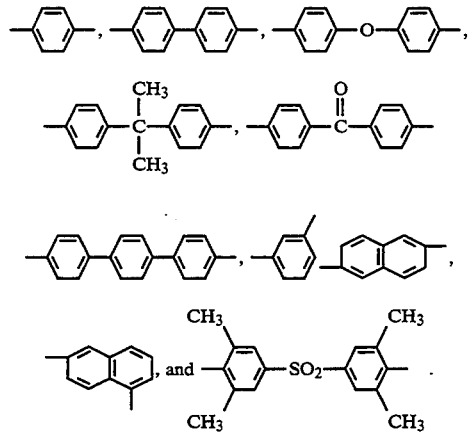

10. The composition according to claim 9 wherein said polyethersulfone is of the formula

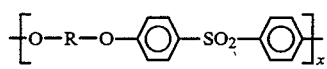

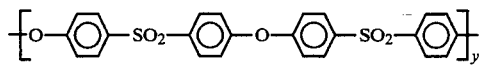

wherein the ratio of x to y is 10:90 to 60:40.

11. A composition according to claim 1 wherein said polyarylsulfidesulfone contain in their backbone structure repeating units of the formula

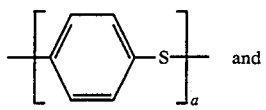 (A)

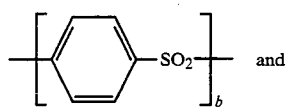 (B)

wherein the ratio of a to b is 1:49 to 49:1, and the aromatic rings are either unsubstituted or substituted by 1 to 4 substituents selected from the group consisting of alkyl groups, aryl, halogen, thioalkyl and ether groups.

12. A curable composition according to claim 1 comprising (a) at least one thermosetting epoxy resin;

(b) from 1 to about 30%, by weight, of a polyethersulfone having repeating units of the formula

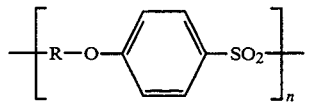

wherein R is selected from the group consisting of

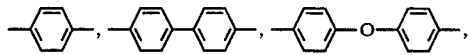

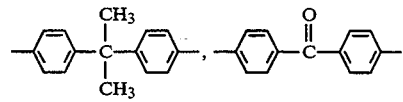

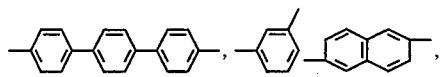

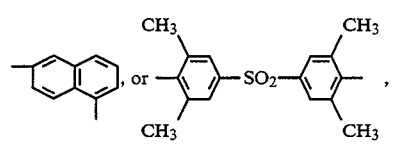

and n is about 10 to about 120, dissolved in said thermosetting epoxy resin;

(c) from about 1 to about 49%, by weight, of a polyarylsulfidesulfone having repeating units of the formula

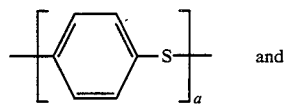

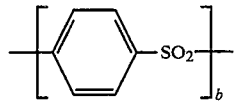

wherein the ratio of a to b is 1:49 to 49:1, and the aromatic rings are either unsubstituted or substituted by 1 to 4 substituents selected from the group consisting of include alkyl groups, aryl, halogen, thioalkyl and ether groups, dispersed in said thermosetting epoxy resin; and (d) at least one hardener for said thermosetting epoxy resin.

13. The product obtained by curing the composition of claim 1.

14. The product obtained by curing the composition of claim 12.

15. A method of improving the mechanical and thermal properties of a curable thermosetting epoxy resin-hardener system which comprises (a) dissolving in said thermosetting epoxy resin prior to the addition of the hardener, from about 1 to 30%, by weight, of a polyethersulfone and (b) subsequent to step (a) and either prior to, simultaneously with or subsequent to the addition of the hardener, dispersing in the thermosetting epoxy resin-polyethersulfone solution, from about 1 to 49%, by weight, of a polyarylsulfidesulfone.

* * * * *